(12) United States Patent
Colleoni et al.

(10) Patent No.: US 10,526,695 B2
(45) Date of Patent: Jan. 7, 2020

(54) SPUTTER UNIT

(71) Applicant: safematic GmbH, Bad Ragaz (CH)

(72) Inventors: Walter Colleoni, Sulz (AT); Patrick Capeder, Maienfeld (CH); Christof Graf, Sevelen (CH)

(73) Assignee: safematic GmbH, Zizers (CH)

( * ) Notice: Subject to any disclaimer, the term of this patent is extended or adjusted under 35 U.S.C. 154(b) by 571 days.

(21) Appl. No.: 15/147,926

(22) Filed: May 6, 2016

(65) Prior Publication Data

US 2016/0326632 A1 Nov. 10, 2016

(30) Foreign Application Priority Data

May 6, 2015 (EP) .................................... 15001341

(51) Int. Cl.
*H01J 37/34* (2006.01)
*C23C 14/34* (2006.01)
(Continued)

(52) U.S. Cl.
CPC ............. *C23C 14/34* (2013.01); *C23C 14/35* (2013.01); *H01J 37/32449* (2013.01); *H01J 37/32715* (2013.01); *H01J 37/32935* (2013.01); *H01J 37/345* (2013.01); *H01J 37/347* (2013.01); *H01J 37/3411* (2013.01);
(Continued)

(58) Field of Classification Search
CPC .... C23C 14/34; C23C 14/35; H01J 37/32935; H01J 37/3411; H01J 37/3435; H01J 37/3444; H01J 37/345; H01J 37/347; H01J 37/3476; H01J 37/3488; H01J 37/32449; H01J 37/32715
See application file for complete search history.

(56) References Cited

U.S. PATENT DOCUMENTS 3,451,912 A * 6/1969 Heurle .................. C23C 14/165
204/192.15
3,679,571 A * 7/1972 Ensslin et al. .......... C23C 14/35
204/298.08
(Continued)

FOREIGN PATENT DOCUMENTS

DE 196 51 615 C1 7/1997
EP 0 955 666 A1 11/1999
(Continued)

OTHER PUBLICATIONS

Extended European Search Report for corresponding of EP Application No. 15001341.5 dated Oct. 23, 2015.
(Continued)

*Primary Examiner* — Rodney G McDonald
(74) *Attorney, Agent, or Firm* — Renner, Otto, Boisselle & Sklar, LLP

(57) ABSTRACT

A sputter unit is introduced comprising a housing, a gas inlet, an interface for removable connecting the sputter unit to a vacuum chamber, a gas outlet arranged for supplying a process gas received via the gas inlet to the vacuum chamber, an interface for removable connecting the sputter unit to a base unit comprising a vacuum pump for generating a vacuum in the vacuum chamber, and a transformer arranged in the housing for increasing a supply voltage into an ionisation voltage for ionising the process gas supplied via the gas outlet to the vacuum chamber.

18 Claims, 5 Drawing Sheets

(51) Int. Cl.
 *H01J 37/32* (2006.01)
 *C23C 14/35* (2006.01)
(52) U.S. Cl.
 CPC ...... *H01J 37/3435* (2013.01); *H01J 37/3444* (2013.01); *H01J 37/3476* (2013.01); *H01J 37/3488* (2013.01)

(56) References Cited

U.S. PATENT DOCUMENTS

| | | | |
|---|---|---|---|
| 4,096,055 A | 6/1978 | Johnson | |
| 4,124,474 A * | 11/1978 | Bomchil | C23C 14/0042 204/192.13 |
| 4,169,031 A | 9/1979 | Brors | |
| 4,173,522 A | 11/1979 | Pulker et al. | |
| 4,311,725 A * | 1/1982 | Holland | C23C 14/546 118/664 |
| 4,412,906 A * | 11/1983 | Sato | H01L 21/31 204/192.12 |
| 4,595,483 A * | 6/1986 | Mahler | H01J 37/34 204/192.12 |
| 4,810,347 A | 3/1989 | Smith | |
| 5,084,151 A | 1/1992 | Vallana et al. | |
| 5,242,566 A | 9/1993 | Parker | |
| 5,254,236 A * | 10/1993 | Kinokiri | C23C 14/042 204/192.12 |
| 5,494,558 A | 2/1996 | Bunshah et al. | |
| 5,507,930 A | 4/1996 | Yamashita et al. | |
| 6,063,245 A | 5/2000 | Frach et al. | |
| 6,077,407 A | 6/2000 | Liehr et al. | |
| 6,103,069 A * | 8/2000 | Davenport | C23C 14/566 204/192.12 |
| 6,375,860 B1 * | 4/2002 | Ohkawa | C23C 16/4401 118/723 E |
| 7,879,209 B2 | 2/2011 | Tilsch et al. | |
| 8,273,221 B2 | 9/2012 | Schneider et al. | |
| 2007/0246356 A1 | 10/2007 | Tokimitsu | |
| 2012/0031748 A1 * | 2/2012 | Ishihara | C23C 14/0042 204/192.13 |
| 2013/0319328 A1 * | 12/2013 | Wurzinger | H01J 37/261 118/696 |
| 2013/0323407 A1 | 12/2013 | Wurzinger et al. | |

FOREIGN PATENT DOCUMENTS

| | | |
|---|---|---|
| EP | 1 964 150 B1 | 4/2012 |
| IN | 1162/CHE/2009 | 6/2009 |
| WO | 2014/191688 A1 | 12/2014 |

OTHER PUBLICATIONS

Leica Microsystems, Living Up to Life, "Vacuum Coating Techniques and Coating Systems for Electron Microscopy", Jan. 2008.
BAL-TEC AG, "Operating Instructions for CTA020/SCD 005 Special", Sep. 27, 2005.
Quorum Technologies Limited Co., Quick Overview, "Q150T Turbo-Pumped Sputter Coater/Carbon Coater", Feb. 23, 2012.
Quick Overview, "BT 150 and BT300 Bench Top Coaters", HHV 2015.

* cited by examiner

SPUTTER UNIT

TECHNICAL FIELD

The present invention relates to a sputter unit, a base unit, an apparatus for sputtering material onto a sample, and to a method for sputtering material onto a sample.

BACKGROUND ART

Conventional apparati for sputtering material onto a sample are built from individual components of large size which may include a transformer, a vacuum pump and a gas supply. Typically, the gas supply and the vacuum pump are connected to a bottom end of a vacuum chamber. Typically, such apparati require many manual steps by an operator for executing a sputtering process.

DISCLOSURE OF THE INVENTION

The problem to be solved by the present invention is to provide an apparatus and related components showing a smaller size and enabling an automated sputtering of samples.

This problem is solved by a sputter unit comprising a housing, an interface for removable connecting the sputter unit to a vacuum chamber, a gas inlet, and a gas outlet arranged for supplying a process gas received via the gas inlet to the vacuum chamber. Additionally, an interface is provided for removable connecting the sputter unit to a base unit comprising a vacuum pump for generating a vacuum in the vacuum chamber. A transformer is arranged in the housing for increasing a supply voltage into an ionisation voltage for ionising the process gas supplied via the gas outlet to the vacuum chamber.

Hence, a compact module is provided, preferably having a size at max of 30 cm in length*20 cm in width*10 cm in height, defined by its housing, which for example, may be made from metal or plastics. This component allows a pulverization of a target material fired by ions at compact size, and in an automated manner.

Conceptually, the supply of process gas into the vacuum chamber now is arranged at an opposite end of the vacuum chamber than the vacuum pump which is in contrast to the designs of the prior art. This results in various significant advantages: Given that the supply of the process gas now is arranged close to an anode and a cathode which are supplied with an ionisation voltage sufficient for ionising the process gas, the ionisation can be conducted more efficient with respect to energy consumption, i.e. less power is required for ionisation than in the art. In addition, the gas supply now is closer to the support table for holding the sample to be sputtered, such that sample can be sputtered more efficient and more uniform. These advantages in turn enable the transformer for generating the ionisation voltage to become smaller in size such that it can be integrated in the housing of the sputter unit. This in turn makes the transformer be arranged close to the anode and cathode such that an elaborate supply of high voltage from a remote transformer can be avoided including electrical and mechanical protection means.

Generally, the sputter unit is a modular component that can be removed from a base unit comprising a vacuum pump and from a vacuum chamber which three components preferably contribute to an apparatus for sputtering material on a sample. Hence, the sputter unit as presently suggested includes an interface connecting to the base unit, also referred to as "sputter unit-base unit interface", and an interface connecting to the vacuum chamber, also referred to as "sputter unit-vacuum chamber interface". In general, both interfaces may encompass mechanical features for connecting the subject two units, while at least the sputter unit-base unit interface may also encompass an electrical interface.

Preferably, the gas inlet and the gas outlet of the sputter unit are represented by one or more holes/openings in members of the sputter unit, and hence are fed through the housing of the sputter unit. While the gas inlet may include a pipe fed through the housing or a connector for a gas supply pipe, the gas outlet is arranged such that it faces an interior of the vacuum chamber as long as the vacuum chamber is connected to the sputter unit via the sputter unit-vacuum chamber interface.

In a preferred embodiment, the gas outlet comprises a dispenser ring preferably made from metal, preferably having a hollow interior such that the ring takes the shape of a tube, and preferably comprising multiple bores facing the vacuum chamber when connected to the sputter unit. By such means, the process gas can be supplied uniform into the vacuum chamber.

In one embodiment the vacuum chamber may be embodied in form or a cylinder wall preferably made from glass having an open top end and an open bottom end. A top rim of the glass cylinder, i.e. its open top end, preferably abuts against the housing or another member of the sputter unit when connected, and preferably abuts against a sealing ring either inserted into a member of the sputter unit, or applied to the rim of the vacuum chamber, or clamped between the vacuum chamber and the sputter unit. The gas outlet preferably is arranged within the sealing ring or, more generally within a circumference where the vacuum chamber is supposed to meet the sputter unit.

In case the vacuum chamber has a cylindrical shape and may meet the sputter unit with a circular end/rim thereof, it is preferred that the dispenser ring is of circular shape as well. In view of a uniform distribution of the process gas into the vacuum chamber resulting in a preferred uniform deposition of a target material onto a sample, it is preferred that the dispenser ring comprises multiple bores enabling process gas to exit, a majority or all of which bores are preferably arranged equidistant.

Preferably, an electrically operable valve is provided for adjusting a flow of the process gas into the gas outlet. A control of the valve will be explained later on in more detail. The valve serves for adjusting the flow of the process gas into the vacuum chamber when connected. In a preferred embodiment, the valve is arranged closer to the gas outlet than to the gas inlet, and specifically, the valve is arranged at a maximum distance of five centimetres from the dispenser ring. This enables a fine control of process gas supply into the vacuum chamber e.g. in the range of a μl/sec throughput which in turn results in a more efficient, and especially power efficient processing which again results in reduced dimensions of the transformer, for example, and hence in an allocation of the transformer close to the sputter head. The sputter head is considered to be the part of the sputter unit that contains the sputter unit-vacuum chamber interface. Between the gas inlet and the gas outlet, the process gas preferably is guided in a pipe. Controlling the process gas by the valve may not only include an adjustment of the flow but also include a termination of the flow or an unrestricted flow of the process gas towards the gas outlet. The valve may in a preferred embodiment comprise a solenoid.

The sputter unit-vacuum chamber interface may additionally include an anode and a cathode electrically connected to the transformer for applying the ionisation voltage there between. During a sputtering process, the ionisation voltage is applied between the anode and the cathode while process gas is supplied via the gas outlet. As a result, the process gas, such as argon, for example, is ionised which ions are directed towards a target, also referred to as target plate, made from a target material, such as Cu or Au. A bombardment of the target by the ions results in target material being dissolved from the target plate and finally depositing on a sample arranged in the vacuum chamber.

The sputter unit preferably comprises a fixture for attaching the target plate given that the target plate may be exchanged upon consumption or upon the requirement to sputter with a different material. Hence, the transformer preferably is electrically connected to the anode on the one hand, and to the fixture and via the fixture to the target plate on the other hand. Preferably, the fixture includes a thread by means of which the target plate can be fixed to the sputter unit. In a preferred embodiment, the fixture is arranged within the dispenser ring. Preferably, the target plate has a circular surface which is surrounded by the dispenser ring in the same plane. Preferably, the anode has the shape of a ring, too, and preferably a circular shape. Such ring shaped anode may be arranged between the dispenser ring and the target with respect to the plane of the target, or more preferably outside the dispenser ring, i.e. between the dispenser ring and the ring to which the vacuum chamber meets upon connecting to the sputter unit. In case the interface comprises a sealing ring as described above, it is preferred that the gas outlet, the target plate and the anode are arranged within the sealing ring.

Such arrangement provides a close and very compact arrangement of the gas outlet, the target plate and the anode. Again, such arrangement proves to be energy efficient and leads to a compact integration in the housing of the sputter unit.

In a preferred embodiment, a magnetic system is provided, preferably in form of a magnetron. The magnetron serves for removing electrons from a path between the target and the sample in order to avoid a re-neutralization of once generated ions on their way to the target.

The transformer preferably receives a supply voltage and transforms this supply voltage into an ionisation voltage required for ionising the process gas in the vacuum chamber. The supply voltage preferably is not the conventional supply voltage out of a wall socket but is a supply voltage supplied by the base unit to be introduced in more detail later on. Preferably, the supply voltage is in the range between 10 V and 100 V DC, and preferably is 24 V DC. This supply voltage is increased to the ionisation voltage which may be in the range between 300 V DC and 1300 V DC, and more preferably between 500 V DC and 1100 V DC. Preferably, the ionisation voltage is electrically adjustable, and is variable. In view of the above, it is preferred that the sputter unit-base unit interface comprises a connector plug, wherein the connector plug comprises at least one pin for the supply voltage. Generally, a plug module of the connector plug at the sputter unit may comprise pins or receptacles, while a plug module at the base unit may comprise the opposite thereof, i.e. receptacles or pins respectively. In a preferred embodiment, the connector plug is a multi-pin connector, such as a 22-pin connector. In a very preferred embodiment, the connector plug comprises a through-hole representing the gas inlet. A sealing may be provided for sealing the gas transmission between the plug module of the sputter unit and the plug module of the base unit. As a consequence, it is preferred that both plug modules comprise the through-hole matching each other upon connecting the sputter unit to the base unit. Hence, it is preferred that the process gas, or possibly a ventilation gas or a purge gas is supplied via the base unit rather than from the outside directly into the sputter unit.

The sputter unit-base unit interface may in addition to the connector plug provide mechanical fixation means for attaching the sputter unit to the base unit, such as clip, screw or other type of connections. The base unit may further comprise a reception area for the sputter unit which reception area comprises the base unit side plug module.

The base unit comprises a housing and a vacuum pump arranged in the housing, for generating a vacuum in the vacuum chamber when connected to the base unit via a corresponding interface. Hence, the vacuum pump, which may include a multitude of vacuum pumps such as a low vacuum pump and in addition a high vacuum pump, is arranged in the base unit but not in the sputter unit. The base unit preferably has a dimension of at max of 0.6 m in length*0.4 m in width*0.4 m in height, defined by its housing, which for example, may be made from metal or plastics. Hence, it is preferred that the base unit is of a size that makes it a table-top unit.

Preferably, the base unit comprises an interface for removable connecting the base unit to a vacuum chamber. This interface may be arranged at a top surface of the base unit such that the vacuum chamber may rest upright on the interface. For this purpose, the base unit may comprise a step in the shape of its housing, a horizontal surface of which step includes the interface towards the vacuum chamber.

Comparable to the sputter unit-vacuum chamber interface, the present base unit-vacuum chamber interface may comprise a metal ring in a component, such as a stand, for example, to place the vacuum chamber with the rim defining its open bottom end on. In case the vacuum chamber is embodied in form or a cylinder wall, its bottom end abuts against such ring in the stand of the base unit, and preferably against a sealing ring either inserted into the stand, and especially into the ring of the stand, or applied to the rim of the vacuum chamber, or clamped between the vacuum chamber and the stand.

Preferably, the stand for the vacuum chamber in the base unit is connected to the vacuum pump for generating a vacuum in the vacuum chamber during processing. It is noted that the vacuum chamber does not entail a vacuum per se but defines a space in form of a recipient into which the sample is arranged, and to which space a vacuum can be established in response to operating the vacuum pump. It is further noted that a vacuum in the spirit of the invention not only encompasses a vacuum in a pure mathematical sense, but entails any low pressure condition sufficient for the ionisation of a subject process gas and sufficient for a deposition of material dissolved from the target by the ions. Preferably, vacuum conditions prior to starting the sputtering process are less than $1\times10^{-5}$ including a fairly low rate of $H_2O$. Such conditions, in combination with a high purity process gas, enhance ionisation, provide for a metered interference and as such result in a multi-directional sputtering of the target material.

In view of some embodiments of the sputter unit referred to above, it is preferred that the base unit comprises a transformer for transforming a wall socket voltage of e.g. 220 V into the supply voltage supplied to the sputter unit via the subject sputter unit-base unit interface, and preferably via the connector plug. In turn, the base unit may have a cable and a connector ready to plug into a wall socket and receive power therefrom. Preferably, the base unit comprises a gas inlet for the supply of the process gas. The gas inlet may take the form of a pipe through a wall of the housing or a plug connection preferably sealed. The base unit may provide a reservoir in its housing for storing an amount of process gas, or may directly supply the process gas from its gas inlet to its gas outlet leading to the sputter unit via a pipe internal to the base unit. A valve in the base unit may control the supply of process gas to the sputter unit. Preferably, the base unit comprises another one or more gas inlets, e.g. for receiving a purging gas and/or a venting gas.

Preferably, a sample support is arranged in an opening of the housing facing the vacuum chamber. The sample support may comprise a plate having a flat top surface for depositing a sample on which sample is intended to be sputtered. The plate may rest on and/or be fixed to a pole that reaches into the interior of the housing of the base unit and is pivot-mounted e.g. in the stand—wherein the pole takes the function of a spindle—or is non-rotatable. Hence, the sample support preferably emerges from the top surface of the base unit, preferably vertically, and may be removable from the base unit and preferably is adjustable in height. In a preferred embodiment, the base unit comprises a drive for one or more of rotating and tilting and planetary moving the sample support or parts thereof. It may be preferred to move the sample by means of a movable sample support in order to achieve a homogeneous coating all over the sample. For this purpose, the sample support may be mounted one or more of tiltable, rotatable, and planetary movable. A corresponding drive may be controlled during the coating as to move the sample support in order to effect this homogeneous coating. In particular a planetary gear may be employed for moving the sample support and as a result the sample during coating.

In a very preferred embodiment, the base unit comprises a sensing arrangement for determining a thickness or height of material sputtered on one of the sample support and the sample. The sputtered material is also referred to as coating. Preferably, the actual sensor of the sensing arrangement is a crystal such as a quartz which is excited to a resonance frequency for sensing. The crystal preferably is arranged on or in the sample support, and specifically on a top surface of the plate where the sample is supposed to be arranged to. The area of the oscillating crystal may, during sputtering, be covered with target material provided the sample is not arranged to cover the oscillating crystal. In this embodiment, the oscillating crystal, excited by electrical power to a resonance frequency may show a deviation of the resonance frequency in response to target material depositing on the oscillating crystal. The amount of the deviation may be a measure of a height of the coating residing on the oscillating crystal. In view of the oscillating crystal being covered by a certain amount of target material, a sample arranged on the sample support is assumed to be covered by the same amount of target material such that from a deviation of the resonance frequency the present thickness of the coating deposited on the sample can be derived. Preferably, such determination of the present thickness is made dependent on a specific weight of the coating material, which is typically known, and the geometry of the area of the oscillating crystal which is known either. The according calculations are preferably conducted by a control unit in the base unit to which the oscillating crystal is electrically connected to, e.g. by means of a flex cable, wherein the signal representing a deviated resonance preferably is transmitted digitally.

In another embodiment, two oscillating crystals are arranged on or in the plate of the sample support at difference locations, e.g. one in the middle of the plate and the other one outside the centre of the plate, e.g. close to its edge. This enables measuring the thickness of the coating for different sample geometries, wherein if one of the oscillating crystals is covered by the sample, the other oscillating crystal may remain uncovered and conduct the measurement. In a different embodiment in which one of the oscillating crystals is uncovered and the other one is covered by the sample, the covered oscillating crystal may serve as a reference spot which enables compensating temperature and other dependencies of the sensing arrangement, e.g. when subtracting the signals stemming from the two oscillating crystals.

Preferably, the control unit is hence configured to adjust the gas supply from the sputter unit into the vacuum chamber by controlling the valve in the sputter unit, e.g. by means of a PWM signal, dependent on the feedback of already deposited target material received from the sensing arrangement. In this context, the supply of process gas may be reduced in view of having reached a one or more of a desired coating speed, and a desired height of the coating, or even may be stopped.

In a further embodiment, a pressure sensor is provided in the base unit or alternatively in the vacuum chamber for sensing a pressure in the vacuum chamber, and therefore preferably is exposed to the pressure of the vacuum chamber when connected to the base unit. A signal of the pressure sensor may be used for one or more of a) controlling the vacuum pump, b) controlling the transformer and via the transformer the ionisation voltage or c) controlling the valve and hence the supply of process gas into the vacuum chamber.

In a further embodiment, a sputter current between anode and cathode is sensed. Preferably, the control unit may be configured to adjust the operation of the transformer in the sputter head dependent on the condition in the vacuum chamber, e.g. dependent on the pressure in the vacuum chamber, and e.g. dependent on the sputter current.

Preferably, the control unit is arranged in the base unit and is embodied as a microprocessor for executing software, or is embodied entirely hardwired, or is embodied in form of firmware, which control unit in one example enables a fully automated sputtering process.

According to a further aspect of the invention a method for sputtering material onto a sample is provided comprising the steps of arranging the sample on a sample support in a vacuum chamber, selecting a desired thickness of material to be sputtered onto the sample—or a different measure representing a desired amount and/or a desired rate of target material to be sputtered—and starting an automated sputtering process. Within this sputtering process it is preferred to automatically supply the process gas in the desired amount into the vacuum chamber, and preferably to control the process gas in the vacuum chamber to a desired and preferably predefined pressure, and to ionise the process gas in response to applying an ionisation voltage, which results in a firing of ions released from the process gas on the target the ions in turn releasing target material. A sputter current is preferably either predefined or is controlled to achieve a desired sputter rate. A thickness of the coating deposited on the sample or the sample support is measured either continuously or at predefined discrete times. The sputtering process preferably is terminated automatically in response to the measured thickness being equal to or exceeding the selected thickness. Preferably, prior to supplying the process gas into the vacuum chamber, a vacuum pump of the base unit is automatically turned on while the pressure in the vacuum chamber is measured continuously or at predefined discrete times.

Prior to starting the automated sputtering process, a suitable target plate may need to be inserted into the fixture by the operator. Arranging the sample onto the sample support may include arranging the sample without covering at least one of the oscillating crystals. Optionally, the presently uncovered oscillating crystal may be determined by the operator via the user interface. Arranging the sample on the sample support may include adjusting the plate of the sample support to the desired height, and/or mounting the sample on the plate by means of stubs, e.g. reaching into small opening of the plate. Preferably, the arranging of the sample on the sample support is performed without having yet attached the vacuum chamber to the base unit and the sputter unit to the base unit. Once the sample is arranged on the sample support, the vacuum chamber may be mounted onto the base unit, and specifically on a sealing of the stand. In a further step, the sputter unit preferably is connected to the base unit via the plug connector.

The automated sputtering process preferably is started by pushing a start button. In response to the start, the vacuum pump is activated and the vacuum chamber is evacuated. It is preferred that the evacuation continues as long as a target start pressure is reached in the vacuum chamber. A pressure sensor arranged in the vacuum chamber or the base unit may sense the present pressure and supply this pressure information in form of a pressure signal to the control unit. The target start pressure may be automatically selected by the sputtering program, or may be selected and entered manually by the operator via the user interface. Preferably, the control unit is configured to control the vacuum pump such that the target start pressure is reached and preferably is maintained. The target start pressure and/or the pressure presently measured may be displayed by the user interface. In one embodiment, once the target start pressure is reached in the pressure chamber, further automated processing steps are released.

As mentioned above, a target thickness of the coating is selected, preferably by being selected and entered by the operator via the user interface, or by the sputtering program selecting a default target coating thickness. This selected target coating thickness represents the height of target material to be deposited onto the sample. The coating thickness measured by the sensing arrangement preferably is used by the control unit for terminating the sputtering process once it reaches the target coating thickness.

In another embodiment, and preferably in addition to entering the target coating thickness, the choice of material of the target plate is selected, either by being entered by the operator via the user interface, or by setting the material to a default material, or by automatically analyzing the material of the inserted target plate. In case the target material can be selected via a multiple choice menu and the target material is not contained in this menu, a specific weight may be entered by the operator thereby specifying the target material.

In another embodiment, one or more of a target processing pressure in the vacuum chamber and a target sputter current may be selected, either by the operator via the user interface, or by a default setting which may be dependent in turn on the selected target material and the selected target coating thickness. The sputter current and/or the target processing pressure may impact a speed/rate of the sputtering process and a uniformity of the sputtered coating. In an embodiment, the process pressure and the sputter current may be calculated by the control unit dependent on the selected target material and possibly dependent on the target coating speed. The control unit may adapt the processing dependent on the target material and/or the target coating thickness and/or the target processing pressure and/or the target sputter current and/or the coating speed.

Preferably, one or more or all of the target coating thickness, the measured coating thickness, the target material, the measured sputter current, the target sputter current, the current process pressure, the target process pressure, a calculated remaining processing time, a past processing time, a sputtering rate, and/or a specific weight of the target material may be displayed to the user on the user interface during the process.

Any of the parameters may be input up-front to initiating the evacuation, may be input after the evacuation, may be input on demand, may be input voluntarily, or may be input or amended even during the process of sputtering. In a different embodiment, only the target material and the target coating thickness are expected to be entered by the user, while all the other parameters are automatically determined or set. In a different embodiment, various different predefined or determined sputtering processes may be offered to the user for selecting, e.g. in response to entering the target material and the target coating thickness.

Preferably, the user may enter via the user interface if the vacuum pump contains an oil based vacuum pump or a non-oil based vacuum pump. In case a non-oil based vacuum pump is selected, the vacuum may be maintained in the vacuum chamber after termination of the sputtering process. This may protect the sample in the vacuum chamber. The selection preferably shall prevent the vacuum being upheld by an oil based vacuum pump which may lead to a pouring of oil into the vacuum chamber in case power to the vacuum pump is disrupted during the "stand-by" period after the sputtering process is terminated in case of maintaining the vacuum in the vacuum chamber.

According to a further aspect of the present invention, an apparatus is provided for sputtering material onto a sample, the apparatus comprising a sputter unit according to any one of the preceding embodiments, a base unit according to any one of preceding embodiments, and a vacuum chamber comprising an open upper end and an open lower end, wherein the vacuum chamber is connected with its open upper end to the sputter unit via the sputter unit-vacuum chamber interface, wherein the vacuum chamber is connected with its lower open end to the base unit via the base unit-vacuum chamber interface, and wherein the sputter unit is connected to the base unit via the sputter unit-base unit interface.

In view of the modular set-up of the apparatus, it is envisaged the base unit can be coupled to a unit different than the sputter unit, which different unit may implement a different process, and in particular a different process of depositing material on a sample arranged on the sample support of the base unit. For this purpose, it is preferred that the base unit comprises an input means for selecting the deposition process to be applied which process should be in accordance with the unit connected to the base unit and the vacuum chamber. Hence, in one embodiment, the method may be enhanced by receiving a process selection via the input means. In response thereto, the according automated process is selected from a library of processes stored in the base unit e.g. in form of software. In a different embodiment, each unit to be attachable to the base unit may comprise a coding, e.g. a mechanical or an electrical coding in the sputter unit-base unit interface, to enable the base unit to automatically select the corresponding processing.

The user interface of the base unit preferably comprises a display for displaying results of the process, parameters measured during processing, etc. The display may be embodied as a touchscreen and enable the above input functions.

According to another aspect of the present invention, a kit of parts is proposed comprising a base unit, a sputter unit, and a vacuum chamber.

Generally, various units and processes can be applied for preparing samples, e.g. for coating samples to subsequently be investigated with an electron microscope with a metal coating that is applied by the sputtering process as disclosed. However, the units/apparatus may also be used in the manufacturing of microelectronic devices which shall also be covered. Here, a thin-film of the target material may be deposited on a substrates or on other layers on a substrate, which target device then shall be referred to as a sample, too. Coatings even in the nm range can be produced by the present apparatus.

The fully automated method provides significant advantages over conventional processing methods in view of reduced processing times, and improved sputtering results in terms of quality given that, for example, the vacuum conditions are not required to be abandoned and the vacuum pump is not to be restarted for the reason for gaining access to the sample and taking a measurement of the coating thickness. In view of the reduced processing times, industrial manufacturing of coated substrates can be realized. New deposition processes can be applied. Samples can be coated by different layers and/or by different orders of processing without interruption of the vacuum. A multipurpose instrument is achieved which, owed its modular set-up, may easily be retooled for different types of processing.

Other advantageous embodiments are listed in the dependent claims as well as in the description below.

The described embodiments similarly pertain to the units and to the method. Synergetic effects may arise from different combinations of the embodiments although they might not be described in detail.

BRIEF DESCRIPTION OF THE DRAWINGS

The embodiments defined above and further aspects, features and advantages of the present invention can also be derived from the examples of embodiments to be described hereinafter and are explained with reference to the drawings. In the drawings it is illustrated in.

MODES FOR CARRYING OUT THE INVENTION

Figure 1:
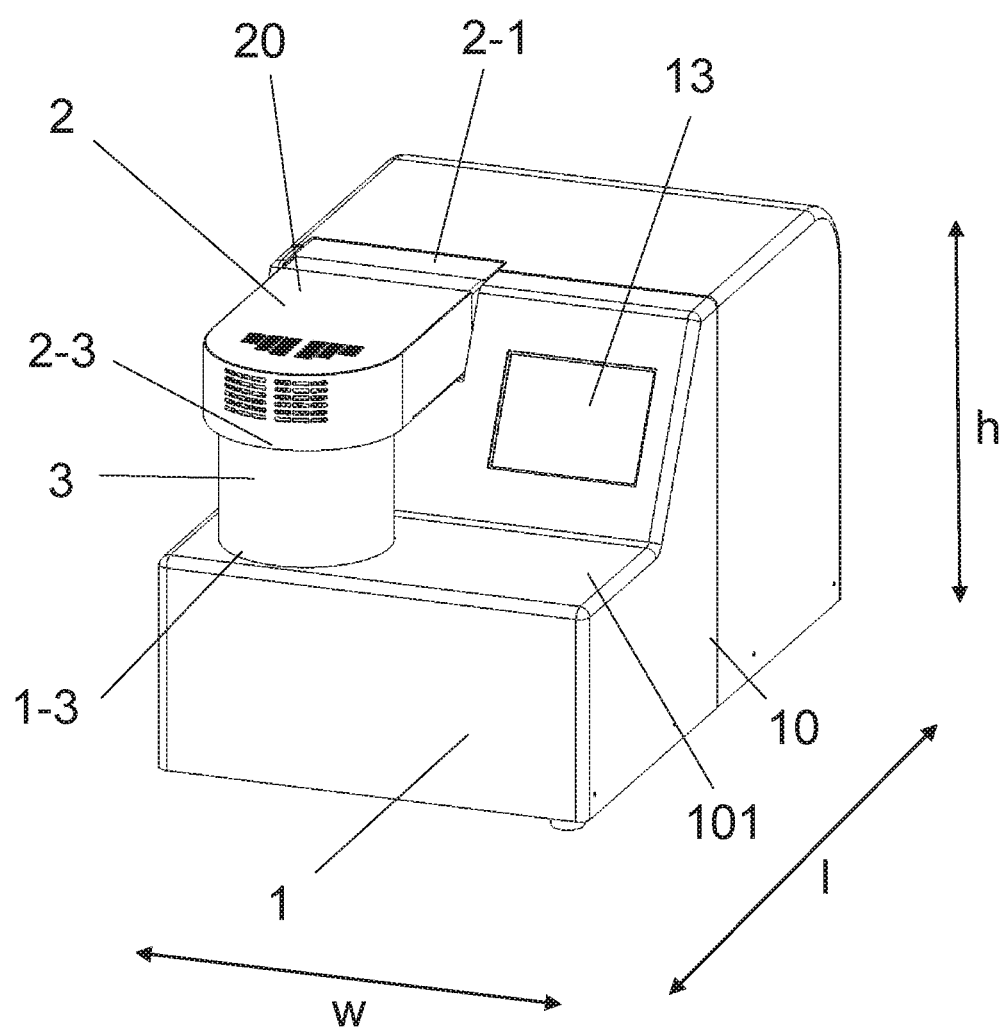
FIG. 1 an apparatus in a perspective view, according to an embodiment of the present invention.

FIG. 1 illustrates a perspective view of an apparatus for sputtering material on a sample according to an embodiment of the present invention. The apparatus comprises a base unit 1, a sputter unit 2 and a vacuum chamber 3. The base unit 1 comprises a housing 10 of length l, e.g. 0.6 m, width w, e.g. 0.4 m, and height h, e.g. 0.4 m, and in the housing 10 a vacuum pump (not visible) for generating a vacuum in the vacuum chamber 3. The vacuum chamber 3 preferably has a shape of a cylinder wall and is made of glass. A base unit-vacuum chamber interface 1-3 provides for a mechanical settling of the vacuum chamber 3 on/in the base unit 1 or a member thereof. Presently, a top surface 101 of the housing 10 provides an opening contributing to the mechanical interface 1-3, into which opening the vacuum chamber 3 reaches for sitting on a stand of the base unit 1, as will be shown in FIG. 5 in more detail. The sputter unit 2 comprises a housing 20, and in the housing 20 a transformer (not visible) for generating an ionisation voltage. In addition, the sputter unit 2 comprises a gas outlet (not visible) for supplying a process gas into the vacuum chamber 3 which process gas is ionised in response to applying the ionisation voltage between an anode and a cathode (not visible). A sputter unit-vacuum chamber interface 2-3 comprises likewise an opening in the housing 20 of the sputter unit 2 such that the vacuum chamber 3 reaches into the opening for e.g. pressing against a sealing ring (not visible). The sputter unit-vacuum chamber interface 2-3 additionally comprises the gas outlet such that the gas can be supplied into the vacuum chamber 3. The sputter unit 2 and the base unit 1 are connected to each other via a sputter unit-base unit interface 2-1 which in the present example comprises a mechanical portion containing a reception, and an electrical portion in form of a connector plug (not visible). Via the connector plug, a supply voltage is supplied from the base unit 1 to the transformer in the sputter unit 2. In addition, the sputter unit-base unit interface 2-1 comprises a gas inlet into the sputter unit 2, preferably in from of a through hole in the plug connector for supplying process gas from the base unit to the sputter unit 2.

The base unit 2 further comprises a user interface 13 in form of a touchscreen as input and output means. The base unit 2 comprises a control unit (not visible) for controlling a sputtering process. The base unit 1 preferably can be connected to a wall socket with a standard power cable. The base unit 1 preferably comprises a gas inlet for supplying a process gas, e.g. argon, to the base unit. Preferably, the base unit 1 additionally comprises another gas inlet for supplying a venting gas, e.g. for supplying N2.

The base unit 1, the sputter unit 2, and the vacuum chamber are removable from each other.

Figure 2:
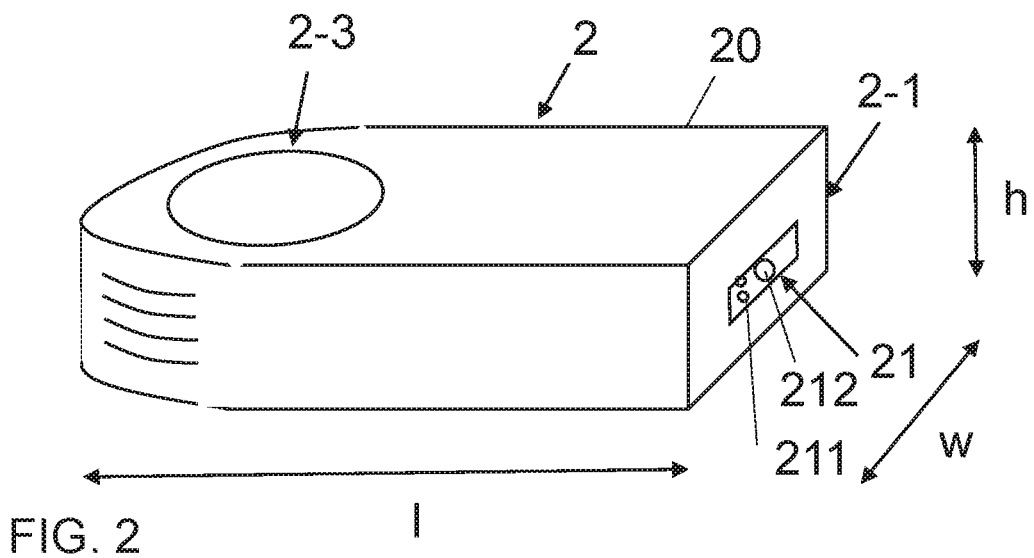
FIG. 2 a sputter unit in a perspective view on its bottom side, according to an embodiment of the present invention.

FIG. 2 illustrates an embodiment of a sputter unit 2 according to an embodiment of the present invention, e.g. as may be used in an apparatus of FIG. 1. The sputter unit 2 comprises a housing 20 of length l, e.g. 30 cm, width w, e.g. 20 cm, and height h, e.g. 10 cm, and a sputter unit-base unit interface 2-1 comprising a connector plug 21. Presently, the sputter unit side of the interface 2-1 comprises a male connector comprising pins 211, e.g. twenty-two pins 211, only two of which are symbolically introduced in FIG. 2. The connector plug 21 comprises a through-hole 212 for supplying gas from the base unit 1 to the sputter unit 2.

Hence, the connector plug 21, possibly in combination with other mechanical means, serves as interface 2-1 towards the base unit 1.

Figure 3:
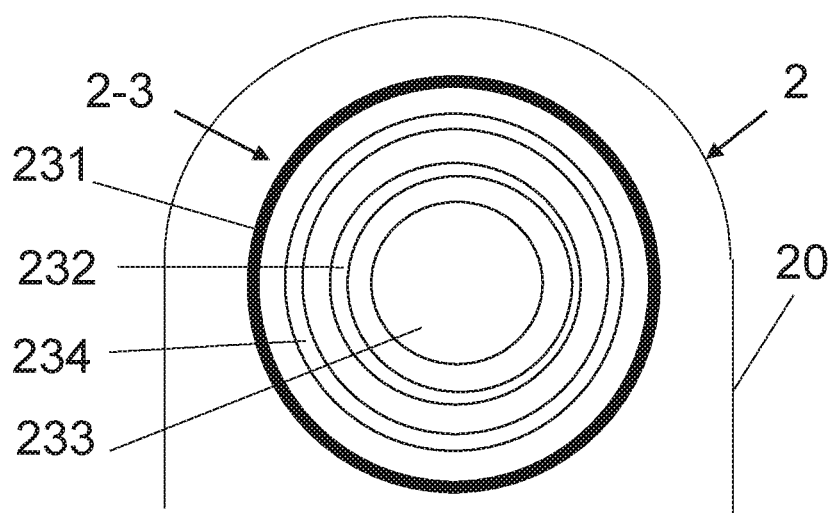
FIG. 3 a view on a sputter head of the sputter unit of FIG. 2.

The sputter unit 2 additionally comprises a sputter unit-vacuum chamber interface 2-3 shown in more detail in a top view in FIG. 3: The sputter unit-vacuum chamber interface 2-3 comprises a sealing ring 231 inserted into a metal ring for pressing against a rim of the vacuum chamber 3 when connecting. Within the sealing ring 231, a dispenser ring 232 comprising multiple bores (not shown) serves as gas outlet for supplying a process gas to the vacuum chamber 3 during the sputtering process. Within the dispenser ring 232, a target plate 233 is illustrated which supplies the target material to be deposited onto the sample in response to the bombardment of the target 233 by ions resolved from the process gas by ionisation in response to an ionisation voltage applied between the target plate 233 serving as cathode and an anode 234. The anode 234 is shown in form of a ring in FIG. 3 between the sealing ring 231 and the dispenser ring 233. Preferably, all the sealing ring 231, the dispenser ring 232, the anode 234 and the target plate 233 are of circular shape. Preferably, the interface 2-3 seals an interior of the sputter unit 2 against the vacuum chamber 3 except for the bores of the dispenser ring 232 for supplying the process gas.

Figure 4:
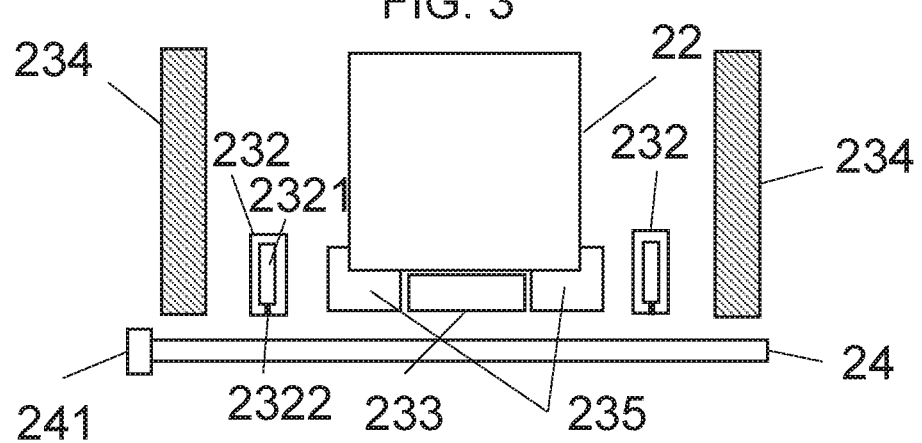
FIG. 4 a cut view of a sputter head, e.g. of the sputter head of FIG. 3, according to an embodiment of the present invention.

FIG. 4 illustrates a schematic cut through a sputter head, which is considered to be the part of the sputter unit 2 that contains the sputter unit-vacuum chamber interface 2-3, e.g. through the sputter head 2 as shown in FIG. 3. It can be derived, that the target plate 233 is mounted via a fixture 235 to a magnetic system 22, and preferably is thermally coupled to the magnetic system 22. The target plate 233 is encircled by the dispenser ring 232, which in turn is encircled by the anode 234. A shutter 24 is provided underneath the target plate 233 which shutter 24 may be hinged and specifically be rotatable around hinge 241 such as to form a removable barrier between the target 233 and the vacuum chamber underneath. The shutter 24 and the fixture 235 are not illustrated in FIG. 3 although preferably being present in this embodiment, too.

Figure 5:
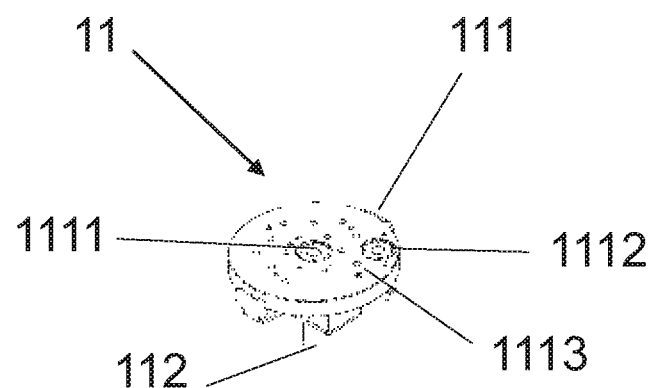
FIG. 5 a sample support as used in a base unit, in a perspective view, according to an embodiment of the present invention.

The magnet system 22 preferably contains a change in magnetization in its centre e.g. by providing a concentric S pole and a ring shaped N pole around the S pole. In addition, a change in magnetization may be provided at close to the circumference of the magnetron, e.g. by means of two ring shaped magnets next to each other. By means of such arrangement, a large torus shaped volume can be generated between the centre magnets and the circumference magnets in which volume ionisation is improved given that free electrons are deflected from this volume and which electrons otherwise would offer a re-neutralization of the ions. FIG. 5 illustrates a sample support 11 in a perspective view comprising a plate 111 and a pole 112. The plate 111 comprises a first opening 1111 and a second opening 1112 for receiving a quartz as oscillating crystal each, and multiple small openings 1113 for receiving e.g. SEM (Scanning Electron Microscopy) stubs for mounting samples onto the plate 111. The plate 111 preferably is adjustable in height. The first opening 1111 is arranged in the centre of the plate 111 while the second opening 1112 is arranged close to an edge of the plate 111. It is preferred that the operator selects to cover the first opening 1111 by a sample to be sputtered if the sample is rather big such that a thickness of the coating sputtered onto the plate 111 can be measured by means of the crystal to be arranged in the second opening 1112. Instead, in case of multiple small samples to be sputtered at the same time, the operator may arrange these samples around the uncovered first opening 1111, and take the measurement of the coating thickness by means of the crystal to be arranged in the first opening 1111. The user interface 13 in the base unit 1 may allow to switch manually between either the first quartz or the second quartz for measuring purposes.

Figure 6:
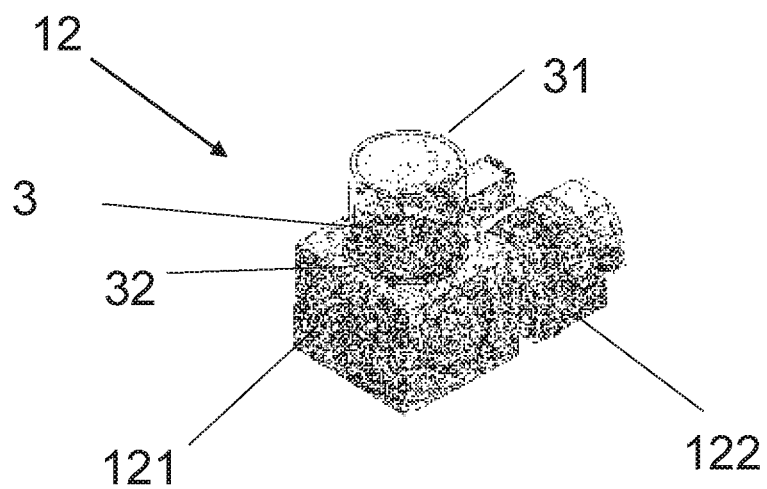
FIG. 6 a vacuum building block as used in a base unit, in a perspective view, according to an embodiment of the present invention.

FIG. 6 illustrates a vacuum building block 12 comprising a stand 121 for receiving a vacuum chamber 3, and a vacuum pump 122. The vacuum chamber 3 in form of a cylinder wall has an upper end 31 and a lower end 32 and rests in the diagram in a reception of the stand 121. The vacuum pump 122 is connected via the stand 121 to the interior of the vacuum chamber 3 for generating a vacuum therein during operation. The vacuum chamber 3 is removable from the stand 1 and so from the base unit 1. Preferably a sealing is provided for sealing the vacuum chamber 3 during operation against an interior of the base unit 1. In the present FIG. 6, the sample support 11 of FIG. 5 is not shown. However, the sample support 11 typically is supported by the stand 121.

Preferably, the mechanical interfaces 2-3 and 1-3 and specifically a diameter and a circumference thereof is of a standardized format. Hence, different vacuum chambers may be attached to the base unit, e.g. distribution vacuum chambers or others, such that the base unit may be utilized also on its own as a vacuum generating unit.

Figure 7:
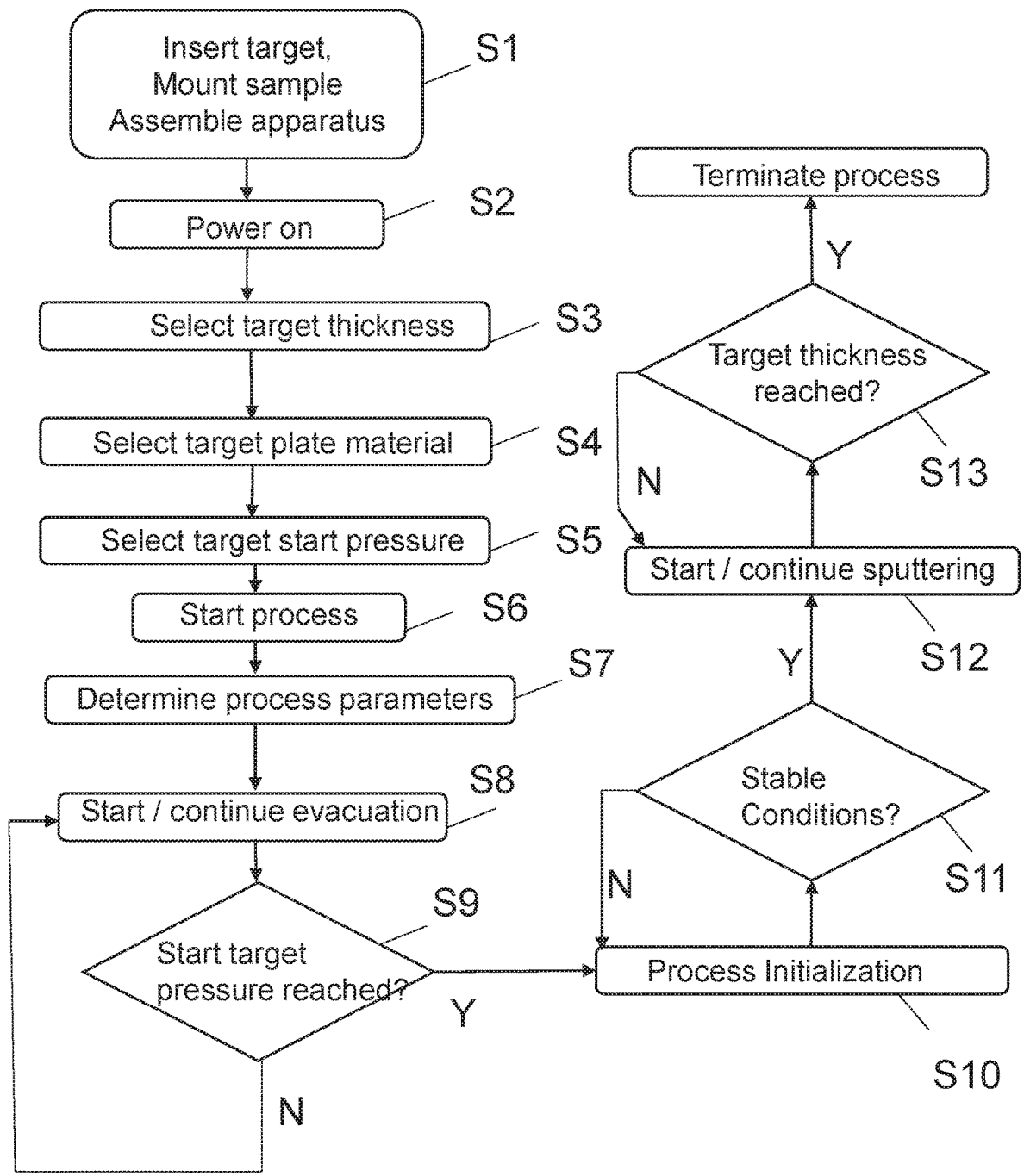
FIG. 7 a flow chart of a method according to an embodiment of the present invention.

FIG. 7 illustrates a flowchart of a method for sputtering on a sample according to an embodiment of the present invention, preferably as conducted with an apparatus e.g. as shown in FIG. 1. In a first step S1, typically conducted manually by an operator of the apparatus, a target plate is mounted to the sputter head, if not already present from a previous sputtering process. One or more samples are mounted on the sample support of the base unit. Then, the sputter unit, the base unit and the vacuum chamber are assembled together. In a next step S2, power of the apparatus is turned on by the operator. Step S1 and S2 can be interchanged, of course. In steps S3, S4 and S5, the user selects via a user interface a target thickness of the coating to be generated on the sample via sputtering from the target plate, the material of the target plate as chosen, and a target start pressure to be reached in the vacuum chamber. Then, the process is started in step S6, either automatically as soon as the control unit determines to have all the input information required for a subsequent fully automated sputtering process, or manually, e.g. by pressing a start button on the user interface.

The control unit may in the following determine relevant processing parameters, see step S7, such as an ionisation voltage profile etc., preferably dependent on the selected target plate material and the selected coating thickness. The processing parameters may also be calculated by the control unit during or at the end of the operator selecting the parameters in steps S3, S4 and S5. In response to starting the process in step S6 or in response to the control unit having determined the processing parameters in step S7, the vacuum chamber is evacuated in step S8 by means of the vacuum pump. In step S9, a pressure in the vacuum chamber is sensed. If the sensed pressure has not reached yet the target start pressure (N), no vacuum conditions are present yet suitable for sputtering such that the evacuation continues in step S8. However, if the start pressure is reached (Y), the sputtering process is initialized automatically in step S10. The sputtering process preferably is initialized by generating stable sputtering conditions. For this purpose, the transformer in the sputter unit may be activated to a high voltage such as 1000V, which subsequently is reduced, e.g. to 600V. Process gas may be supplied to the vacuum chamber at a defined amount, and a sputtering current may be measured.

In case the apparatus has a shutter, the shutter preferably is closed during this initialization period for preventing from releasing depositing target material yet onto the sample prior to having reached stable conditions. In step S11, a pressure in the vacuum chamber and the sputter anode-cathode current are monitored, and only if stable conditions have been reached in step S11 (Y), the shutter is opened in step S12, and the sputtering is started.

In step S13, a thickness of the coating already deposited is sensed and compared to the target thickness. If the target thickness is not reached yet (N), the sputtering is continued in step S12. If, at some point in time the target thickness is reached (Y), the sputtering process is automatically terminated in step S14, which may include deactivating the transformer, closing a valve for the process gas, deactivating the vacuum pump, etc. Alternatively, the vacuum pump may continue to operate. Finally, in both cases, the user may dismount the sputter unit from the base unit and the vacuum chamber and remove the coated sample from the sample support.

Figure 8:
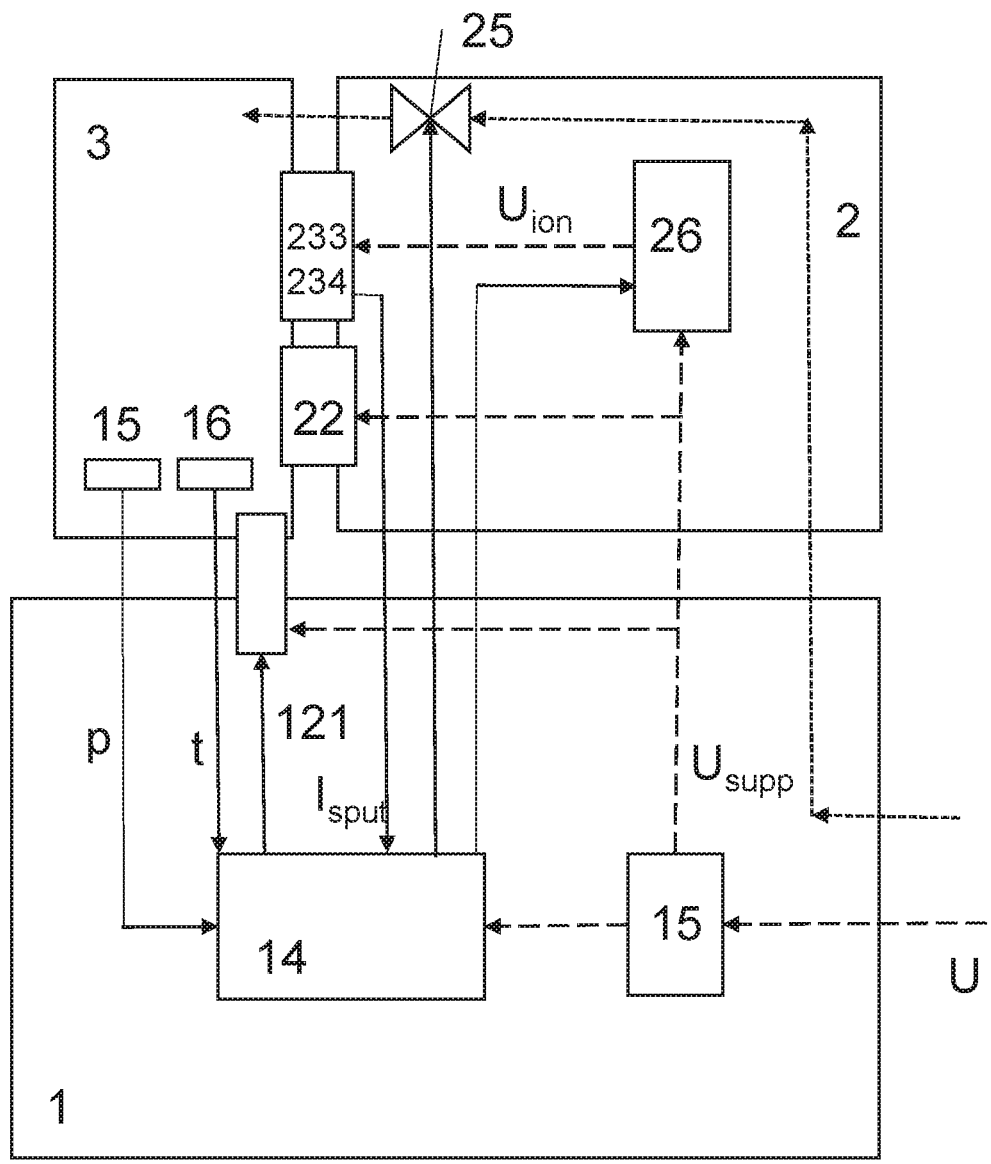
FIG. 8 block diagram of an apparatus according to an embodiment of the present invention.

FIG. 8 illustrates a block diagram of an apparatus according to an embodiment of the present invention. The flow of process gas is illustrated by dotted arrows. The process gas is supplied from external to the base unit, is directed via the interface 2-1 to the sputter unit 2, passes an electrically controllable valve 25, and may enter the vacuum chamber 3.

Power distribution is indicated by dashed lines: External voltage U is supplied to the base unit 1, and specifically to a transformer 15 transforming the external voltage U into a supply voltage Usupp, which on the one hand supplies components of the base unit 1 with power, such as a vacuum pump 121 or a control unit 14, and on the other hand is supplied via the interface 2-3 to the sputter unit 2, and specifically to a transformer 26 transforming for transforming the supply voltage Usupp into an ionisation voltage Uion with is supplied to the anode/cathode configuration 233, 234.

Control and sensor signals are indicated by straight lines. For example, a pressure sensor 15 and a coating thickness sensor 16 provide signals representing the pressure p in the vacuum chamber and a deposited thickness t to the control unit 14. So does the sputter unit 2 with a measured sputter current Isput. On the other hand, the control unit 14 controls the vacuum pump 121, the transformer 26 in the sputter unit 2, and the valve 25 by corresponding control signals.

The invention claimed is:
1. A sputter unit, comprising:
a housing,
a gas inlet for supplying a process gas to the sputter unit,
a first interface for removably connecting the sputter unit to a vacuum chamber,
a gas outlet arranged for supplying the process gas received via the gas inlet to the vacuum chamber for ionizing the process gas in the vacuum chamber during a sputtering process,
a second interface for removably connecting the sputter unit to a base unit comprising a vacuum pump for generating a vacuum in the vacuum chamber, and
a transformer arranged in the housing for increasing a supply voltage into an ionisation voltage for ionising the process gas supplied via the gas outlet to the vacuum chamber, and
wherein the sputter unit base unit second interface comprises a connector plug, and wherein the connector plug comprises at least one pin for the supply voltage.

2. A sputter unit according to claim 1,
wherein the gas outlet comprises a dispenser ring comprising multiple bores facing the vacuum chamber when connected to the sputter unit.
3. A sputter unit according to claim 2,
wherein the dispenser ring has a circular shape, and
wherein the bores are arranged equidistant in the dispenser ring.
4. A sputter unit according to claim 1, comprising:
an electrically operable valve for adjusting a flow of the process gas into the gas outlet,
wherein the valve is arranged closer to the gas outlet than to the gas inlet.
5. A sputter unit according to claim 4,
wherein the gas outlet comprises a dispenser ring comprising multiple bores facing the vacuum chamber when connected to the sputter unit, and
wherein the valve is arranged at a maximum distance of five centimetres from the dispenser ring.
6. A sputter unit according to claim 1, comprising:
an anode and a cathode electrically connected to the transformer for applying the ionisation voltage there between, and
a magnetic system for deflecting electrons resulting from the ionisation of the process gas.
7. A sputter unit according to claim 1, comprising:
a fixture for a target plate for releasing material in response to ions ionised from the process gas firing at the target plate.
8. A sputter unit according to claim 7, comprising:
a target plate held by the fixture, and
an anode and a cathode electrically connected to the transformer for applying the ionisation voltage there between,
wherein the target plate is the cathode.
9. A sputter unit according to claim 8,
wherein the sputter unit-vacuum chamber first interface comprises a sealing ring for sealing against a rim of the vacuum chamber, and
wherein the gas outlet is arranged between the target plate and the sealing ring.
10. A sputter unit according to claim 1,
wherein the connector plug comprises a through-hole representing the gas inlet.
11. A sputter unit according to claim 1,
wherein the housing has a dimension of length l*width w*height h, with l<30 cm, w<20 cm and h<10 cm.
12. A base unit, comprising:
a housing,
a first interface for removably connecting the base unit to a vacuum chamber,
a vacuum pump arranged in the housing for generating a vacuum in the vacuum chamber,
a second interface for removably connecting the base unit to a sputter unit comprising a gas outlet for supplying a process gas to the sputter unit, and
a transformer for transforming a wall socket voltage into a supply voltage and for supplying the supply voltage to the sputter unit,
wherein the sputter unit base unit second interface comprises a connector plug, and
wherein a plug module of the connector plug at the base unit comprises at least one pin or receptacle for the supply voltage.

13. A base unit according to claim 12, comprising
a sample support for disposing a sample to be sputtered,
a sensing arrangement for determining a thickness of a coating sputtered on one or more of the sample support and the sample.

14. A base unit according to claim 13
wherein the sensing arrangement comprises an oscillating crystal arranged in the sample support for enabling the determination of the thickness of the coating sputtered onto the oscillating crystal, and
wherein the sensing arrangement comprises two oscillating crystals arranged at two different locations of the sample support for enabling the determination of the thickness of the coating sputtered onto the respective oscillating crystal.

15. A base unit according to claim 12, comprising:
a control unit adapted to generate a control signal for controlling a supply of the process gas into the vacuum chamber dependent on the determined thickness of the coating sputtered.

16. A base unit according to claim 12, comprising:
a drive for one or more of rotating and tilting and planetary moving the sample support or parts thereof.

17. A base unit according to claim 12, comprising
a pressure sensor for sensing a pressure in the vacuum chamber, and
a control unit adapted to control an ionisation voltage dependent on the pressure sensed by the pressure sensor.

18. An apparatus for sputtering material onto a sample, comprising:
a sputter unit according to claim 1,
a base unit comprising:
a housing,
a first interface for removably connecting the base unit to a vacuum chamber,
a vacuum pump arranged in the housing for generating a vacuum in the vacuum chamber,
a second interface for removably connecting the base unit to a sputter unit comprising a gas outlet for supplying a process gas to the sputter unit, and
a transformer for supplying a supply voltage to the sputter unit, and
a vacuum chamber comprising an open upper end and an open lower end,
wherein the vacuum chamber is connected with its open upper end to the sputter unit via the sputter unit-vacuum chamber interface,
wherein the vacuum chamber is connected with its open lower end to the base unit via the base unit-vacuum chamber interface, and
wherein the sputter unit is connected to the base unit via the sputter unit-base unit second interface.

* * * * *